(12) United States Patent
Tabata (10) Patent No.: US 6,680,835 B2
(45) Date of Patent: Jan. 20, 2004

(54) SEMICONDUCTOR DEVICE (75) Inventor: Mitsuharu Tabata, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 8 days.

(21) Appl. No.: 09/944,584

(22) Filed: Sep. 4, 2001

(65) Prior Publication Data

US 2002/0141126 A1 Oct. 3, 2002

(30) Foreign Application Priority Data

Apr. 3, 2001 (JP) ........................... 2001-104546

(51) Int. Cl.$^7$ ................................................. H02H 3/18
(52) U.S. Cl. ............................................. 361/79; 361/79
(58) Field of Search .......................... 361/93.7, 93.9, 361/101, 58, 103, 106, 79, 56

(56) References Cited

U.S. PATENT DOCUMENTS

| | | | |
|---|---|---|---|
| 4,146,903 A | | 3/1979 | Dobkin |
| 4,302,726 A | * | 11/1981 | Shobbrook ................ 330/260 |
| 4,698,655 A | | 10/1987 | Schultz |
| 5,061,863 A | | 10/1991 | Mori et al. |
| 5,229,757 A | | 7/1993 | Takamiya et al. |
| 5,262,665 A | * | 11/1993 | Mori .......................... 257/378 |
| 5,281,872 A | | 1/1994 | Mori |
| 5,375,029 A | * | 12/1994 | Fukunaga et al. .......... 361/101 |
| 5,396,117 A | * | 3/1995 | Housen et al. ............. 327/480 |
| 5,500,619 A | * | 3/1996 | Miyasaka ................... 327/427 |
| 5,510,943 A | * | 4/1996 | Fukunaga ................... 361/18 |
| 5,608,595 A | * | 3/1997 | Gourab et al. ............. 361/79 |
| 5,710,508 A | * | 1/1998 | Watanabe ................... 323/284 |
| 5,926,012 A | * | 7/1999 | Takizawa et al. ........... 323/284 |
| 6,057,728 A | | 5/2000 | Igarashi |
| 6,194,884 B1 | * | 2/2001 | Kesler et al. .............. 323/285 |
| 2001/0009494 A1 | * | 7/2001 | Umekawa ................... 361/93.9 |

FOREIGN PATENT DOCUMENTS

| | | |
|---|---|---|
| DE | 40 15 625 | 11/1990 |
| DE | 43 12 337 | 10/1993 |
| DE | 43 34 386 | 4/1994 |
| DE | 43 42 082 | 6/1994 |
| DE | 198 25 211 | 4/1999 |
| DE | 696 10 457 | 2/2001 |
| JP | 5-275704 | 10/1993 |
| JP | 6-164344 | 6/1994 |
| JP | 7-183781 | 7/1995 |
| JP | 7-297358 | 11/1995 |
| JP | 10-32476 | 2/1998 |
| JP | 11-299218 | 10/1999 |
| WO | WO 01/22584 | 3/2001 |

\* cited by examiner

Primary Examiner—Brian Sircus
Assistant Examiner—Danny Nguyen
(74) Attorney, Agent, or Firm—Oblon, Spivak, McClelland, Maier & Neustadt, P.C.

(57) ABSTRACT

It is an object to provide a semiconductor device comprising a short circuit protecting system capable of enhancing the detection precision of a collector current, thereby carrying out a reliable short circuit protection. An IGBT (1) having a collector (C) connected to a terminal (T1) and an emitter (E) connected to a terminal (T2) is provided, and has a sense emitter (SE) connected to a terminal (T2) through a variable resistor (VR1) to be a current and voltage converting section. A sense potential is output from an end on the sense emitter (SE) side of the variable resistor (VR1) and is given to a terminal (T11) of a current ratio detecting section (15). A gate of the IGBT (1) is connected to a terminal (T3) and an output of the current ratio detecting section (15) is connected to a terminal (T4).

6 Claims, 6 Drawing Sheets

SEMICONDUCTOR DEVICE

BACKGROUND OF THE INVENTION

1. Field of the Invention

The present invention relates to a semiconductor device and more particularly to a semiconductor device having a short circuit protecting function for preventing a short circuit of a semiconductor element such as an insulated gate bipolar transistor (IGBT).

2. Description of the Background Art

In an IGBT in which a large current flows as a main current, a sense emitter to be used for measuring a current is provided separately from an emitter in which the main current flows, and the main current can be indirectly monitored by measuring a current (sense current) of the sense emitter with a conversion into a voltage through a current and voltage converting section.

Figure 9:
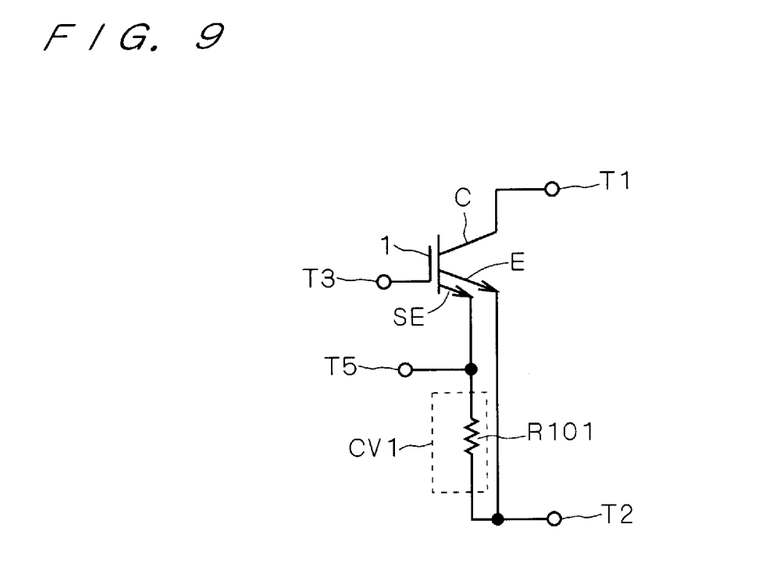
FIGS. 9 to 11 are diagrams showing a structure of a conventional semiconductor device.

As an example of the current and voltage conversion, FIG. 9 shows a structure using a resistor. In FIG. 9, an IGBT 1 having a collector C connected to a terminal T1 and an emitter E connected to a terminal T2 is provided, and has a sense emitter SE connected to the terminal T2 through a resistor R101 to be a current and voltage converting section CV1. A terminal T5 for outputting a sense emitter voltage is connected to an end on the sense emitter SE side of the resistor R101. The IGBT 1 has a gate connected to a terminal T3.

Figure 10:
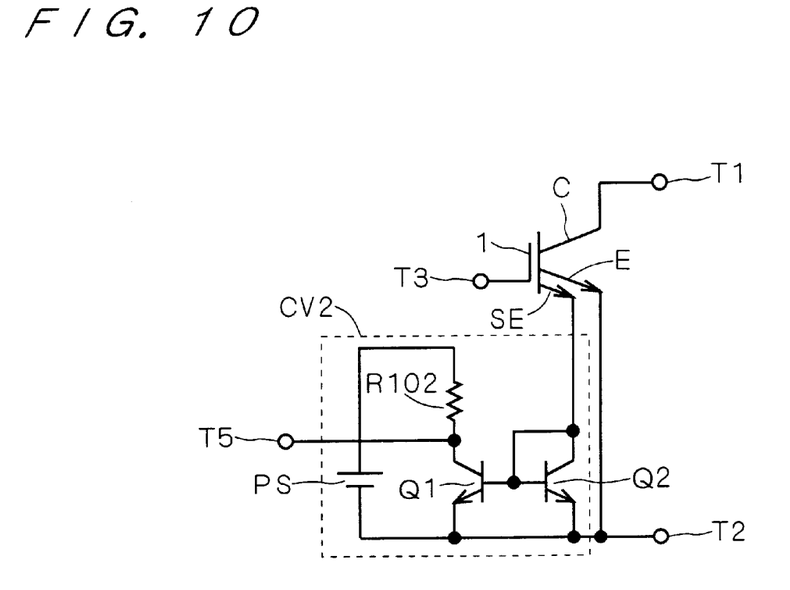

As an example of the current and voltage conversion, FIG. 10 shows a structure using a current mirror circuit. In FIG. 10, the same structures as those in FIG. 9 have the same reference numerals and repetitive description will be omitted.

In FIG. 10, a sense emitter SE of an IGBT 1 is connected to a collector of a transistor Q2 constituting a current and voltage converting section CV2. The transistor Q2 is paired with a transistor Q1 to constitute the current mirror circuit, and both gates are connected to the sense emitter SE in common and both emitters are connected to a terminal T2 in common.

A collector of the transistor Q1 is connected to a positive electrode of a constant voltage source PS through a resistor R102, a negative electrode of the constant voltage source PS is connected to the terminal T2, and a terminal T5 for outputting a sense emitter voltage is connected to an end on the transistor Q1 side of the resistor R102.

The current and voltage converting section CV2 constituted by the current mirror circuit can lessen a voltage drop with a current and voltage conversion to carry out a measurement.

Figure 11:
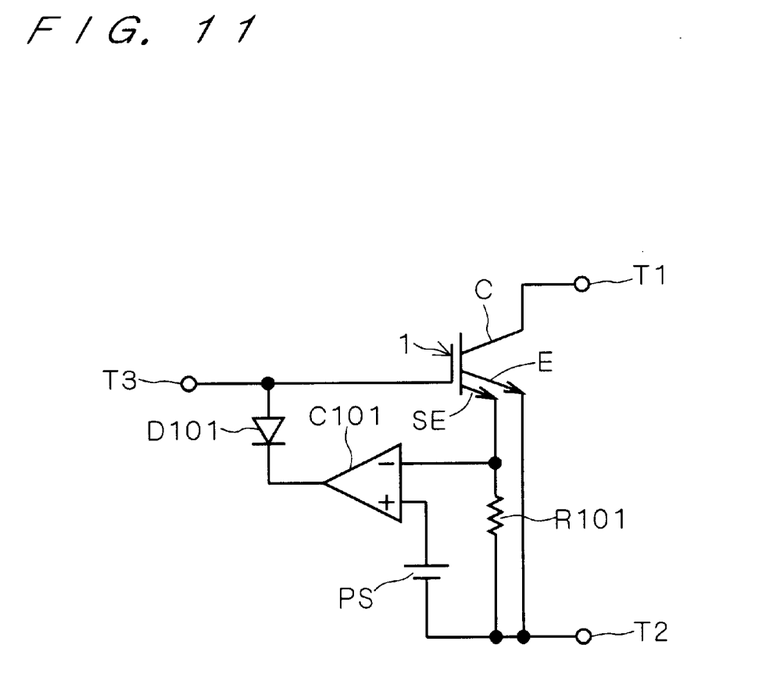

FIG. 11 is a diagram showing a structure of a short circuit protecting circuit for measuring a sense emitter voltage to protect a short circuit by using a resistor R101 as a current and voltage converting section.

In FIG. 11, a sense emitter voltage output from an end on the sense emitter SE side of the resistor R101 is input to an input terminal on the positive side of a comparator C101 and a positive electrode of a constant voltage source PS is connected to an input terminal on the negative side of the comparator C101.

An output terminal of the comparator C101 is connected to a cathode of a diode D101 and an anode of the diode C101 is connected to a gate of an IGBT 1.

In a short circuit protecting circuit having such a structure, a predetermined voltage supplied from the constant voltage source PS is compared with the sense emitter voltage. If the sense emitter voltage is higher than the predetermined voltage, it is decided that a sense emitter current abnormally flows. Consequently, a current is caused to flow from the gate of the IGBT 1 toward an emitter through the diode D101, thereby dropping a gate voltage and reducing a collector current of the IGBT 1.

There is a problem in that the sense emitter current is assumed to have a uniquely simple correlation with the collector current.

More specifically, an electric potential of the sense emitter SE is increased with the detection of the sense current in an actual circuit. For example, therefore, in some cases in which an electric potential of a collector C is low, the electric potentials of the collector C and the sense emitter SE become insufficient so that the sense emitter current is measured to be small even if a large collector current flows. For this reason, the detection precision of the collector current is reduced and a sufficient protection cannot be obtained in some cases. In addition, a rise in a collector voltage rapidly increases the sense emitter current with a start of a protecting operation so that the protecting operation is promoted. Furthermore, a positive feedback in which the gate voltage is decreased to increase the collector voltage is generated and the sense emitter current is rapidly increased with a delay of the operation of a protection circuit, thereby causing a malfunction in some cases.

Moreover, the collector current is rapidly reduced by the inaccurate detection of the collector current. In the IGBT to be used for controlling a large current, for example, there is a problem in that a high surge voltage is generated.

In order to solve these problems, a structure for detecting a collector voltage has also been proposed. However, the collector of the IGBT is provided on the high potential side. Therefore, a detection circuit corresponding to a high voltage is required so that a manufacturing cost is increased and a large space for providing the detection circuit is required, resulting in an increase in a size of the device. Moreover, a countermeasure to be taken against a noise made from various circuits on the high potential side becomes complicated.

Japanese Patent Application Laid-Open No. 11-299218 (1999) has disclosed a structure in which a sense emitter and an emitter in an IGBT are imaginarily short-circuited by using an operational amplifier, thereby preventing a fluctuation in a sense emitter voltage. In order to implement such a structure, it is necessary to prepare a power supply having a lower potential than an emitter potential. In addition, in the case in which the structure is to be implemented as a monolithic IC, there is a problem in that a countermeasure to be taken against a noise becomes complicated because an emitter potential to be an original grounding potential is an intermediate potential of a power supply of the monolithic IC.

SUMMARY OF THE INVENTION

A first aspect of the present invention is directed to a semiconductor device comprising a transistor having a sense emitter, and a protecting system for carrying out a protecting operation for detecting a sense current flowing to the sense emitter to control a collector current, the protecting system including a current and voltage converting section having a variable resistor for converting the sense current into different voltages by change of a resistance value thereof, thereby generating a plurality of sense voltages, and a current ratio detecting section for receiving the sense voltages output from the current and voltage converting section and information about a resistance value of the variable resistor corresponding to the sense voltages, thereby calculating a ratio of each of the sense voltages to each of the resistance values and detecting an amount of change of the ratio thus calculated.

A second aspect of the present invention is directed to the semiconductor device according to the first aspect of the present invention, wherein a resistance value of the variable resistor is varied in response to a voltage signal which is changed on a time basis, the information about the resistance value of the variable resistor is the voltage signal which is changed on a time basis, and the resistance value of the variable resistor and the voltage signal which is changed on a time basis have a proportional relationship.

A third aspect of the present invention is directed to a semiconductor device comprising a transistor having a sense emitter, and a protecting system for carrying out a protecting operation for detecting a sense current flowing to the sense emitter to control a collector current, the protecting system including a current and voltage converting section for converting the sense current into a voltage and outputting the voltage, a forcible voltage changing section for applying external voltages having different values to the sense emitter and forcibly changing a sense emitter potential by the current and voltage converting section, thereby outputting the voltages thus changed as a plurality of sense voltages from the current and voltage converting section, and a current ratio detecting section for receiving the sense voltages output from the current and voltage converting section and information about the external voltages corresponding to the sense voltages, thereby calculating a ratio of each of the sense voltages to each of the external voltages and detecting an amount of change of the ratio thus calculated.

A fourth aspect of the present invention is directed to the semiconductor device according to the third aspect of the present invention, wherein the current and voltage converting section is a current mirror circuit having an input section connected to the sense emitter, the external voltage is generated by a variable resistor connected between an output end of a voltage source of the current mirror circuit and the sense emitter, a resistance value of the variable resistor is changed in response to a voltage signal which is changed on a time basis, the information about the external voltage is the voltage signal which is changed on a time basis, and the resistance value of the variable resistor and the voltage signal which is changed on a time basis have a proportional relationship.

A fifth aspect of the present invention is directed to a semiconductor device comprising a transistor having a sense emitter, and a protecting system for carrying out a protecting operation for detecting a sense current flowing to the sense emitter to control a collector current, the protecting system including a current and voltage converting section having a resistance variable section for converting the sense current into different voltages by change of a resistance value thereof, thereby generating a plurality of sense voltages, a voltage comparator serving to input the sense voltages output from the current and voltage converting section and having two high and low comparison potentials set by a hysteresis, and connecting means for electrically connecting a gate of the transistor to a predetermined electric potential based on an output of the voltage comparator.

A sixth aspect of the present invention is directed to the semiconductor device according to the firth aspect of the present invention, wherein the resistance variable section includes first and second resistors connected in series between the sense emitter and an emitter of the transistor, and a switch element electrically connected in parallel with one of the first and second resistors, an ON/OFF operation of the switch element being controlled based on the output of the voltage comparator.

A seventh aspect of the present invention is directed to the semiconductor device according to the fifth aspect of the present invention, wherein the connecting means is a diode having a cathode connected to the output of the voltage comparator and an anode connected to the gate of the transistor.

An eighth aspect of the present invention is directed to a semiconductor device comprising a transistor having a sense emitter, and a protecting system for carrying out a protecting operation for detecting a sense current lowing to the sense emitter to control a collector current, the protecting system including a current and voltage converting section having a resistance variable section for converting the sense current into different voltages by change of a resistance value thereof, thereby generating a plurality of sense voltages, first and second voltage comparators for inputting the sense voltages output from the current and voltage converting section, an extension circuit connected to an output side of the first voltage comparator and serving to extend a time required for change such that a time in which an output of the first voltage comparator is changed from a second potential to a first potential is longer than a time in which the output of the first voltage comparator is changed from the first potential to the second potential, a variable d.c. power supply for changing a comparison voltage of the second voltage comparator based on the output of the first voltage comparator, and connecting means for electrically connecting a gate of the transistor to a predetermined electric potential based on an output of the second voltage comparator.

A ninth aspect of the present invention is directed to the semiconductor device according to the eighth aspect of the present invention, wherein the resistance variable section includes first and second resistors connected in series between the sense emitter and an emitter of the transistor, and a switch element electrically connected in parallel with one of the first and second resistors, an ON/OFF operation of the switch element being controlled based on the output of the first voltage comparator.

A tenth aspect of the present invention is directed to the semiconductor device according to the eighth aspect of the present invention, wherein the connecting means is a diode having a cathode connected to the output of the second voltage comparator and an anode connected to the gate of the transistor.

An eleventh aspect of the present invention is directed to a semiconductor device comprising a transistor having at least two sense emitters, and a protecting system for carrying out a protecting operation for detecting a sense current flowing to the at least two sense emitters to control a collector current, the protecting system including a current and voltage converting section for converting the sense current flowing to the at least two sense emitters into voltages, thereby generating at least two sense voltages which are different from each other, and a current ratio detecting section for receiving the at least two sense voltages output from the current and voltage converting section, thereby calculating a ratio of the at least two sense voltages.

A twelfth aspect of the present invention is directed to the semiconductor device according to the eleventh aspect of the present invention, wherein the current and voltage converting section includes at least two resistors having different resistance values which are connected between the at least two sense emitters and an emitter of the transistor, respectively.

According to the first aspect of the present invention, the current ratio detecting section receives a plurality of sense voltages output from the current and voltage converting section and information about the resistance value of the variable resistor corresponding to the sense voltages, thereby calculating the ratio of each of the sense voltages to each of the resistance values and detecting the amount of change thereof. Thus, a pattern of a short circuit state of the transistor can be known based on the amount of change. As a result, a short circuit protecting operation is carried out corresponding to the pattern of the short circuit state. Thus, it is possible to implement the short circuit protecting operation in consideration of a difference in the short circuit state depending on a magnitude of a collector voltage. Moreover, it is not necessary to detect the collector voltage. Therefore, a detection circuit corresponding to a high voltage and a large space for providing the detection circuit are not required, and a manufacturing cost can be reduced and a size of the device can be prevented from being increased.

According to the second aspect of the present invention, it is possible to obtain a practical structure for changing the resistance value of the variable resistor. Moreover, the information about the resistance value of the variable resistor is given through the voltage signal which is changed on a time basis and has a proportional relationship with the resistance value of the variable resistor. Therefore, it is possible to easily carry out an operational processing or the like in the current ratio detecting section.

According to the third aspect of the present invention, a plurality of sense voltages output from the current and voltage converting section and information about external voltages corresponding to the sense voltages are received to calculate a ratio of each of the sense voltages to each of the external voltages and to detect the amount of change thereof. Consequently, it is possible to know a pattern of a short circuit state of the transistor based on the amount of change. As a result, a short circuit protecting operation is carried out corresponding to the pattern of the short circuit state. Thus, it is possible to implement the short circuit protecting operation in consideration of a difference in the short circuit state depending on a magnitude of a collector voltage. Moreover, it is not necessary to detect the collector voltage. Therefore, a detection circuit corresponding to a high voltage and a large space for providing the detection circuit are not required, and a manufacturing cost can be reduced and a size of the device can be prevented from being increased.

According to the fourth aspect of the present invention, the current mirror circuit is used for the current and voltage converting section. Consequently, it is possible to lessen a drop in a voltage with a current and voltage conversion, thereby measuring an emitter voltage. Moreover, a voltage source of the current mirror circuit is used for generating an external voltage and a value thereof is changed through the variable resistor. Therefore, it is possible to simply obtain a structure required for the application of the external voltage and to prevent a manufacturing cost from being increased.

According to the fifth aspect of the present invention, the voltage comparator compares each of the sense voltages output from the current and voltage converting section with two high and low comparison potentials set by a hysteresis. Consequently, in the case in which the sense voltage for each resistance value exceeds one of the comparison potentials but does not exceed the other comparison potential or exceeds both of the two comparison potentials, a sense voltage characteristic can be analyzed in more detail. Therefore, a short circuit protecting operation can be carried out more properly. Moreover, the gate of the transistor is electrically connected to the predetermined electric potential through the connecting means based on the output of the voltage comparator. In the case in which the short circuit protecting operation is required, consequently, the gate of the transistor is connected to the predetermined electric potential to decrease a gate current. Thus, a collector current can be reduced to carry out the short circuit protection.

According to the sixth aspect of the present invention, it is possible to obtain a practical and simple structure of the resistance variable section.

According to the seventh aspect of the present invention, it is possible to obtain a practical and simple structure of the connecting means.

According to the eighth aspect of the present invention, there are provided the first and second voltage comparators to which the sense voltages output from the current and voltage converting section are input. Based on the output of the first voltage comparator, the comparison voltage of the second voltage comparator is changed through the variable d.c. power supply. Therefore, the sense voltage can be compared with at least two comparison voltages. Thus, it is possible to carry out the short circuit protecting operation more properly. Moreover, the extension circuit is provided. Therefore, it is possible to extend the period for detection of the second comparator to determine the execution and stop of the protecting operation. Thus, it is possible to prevent a malfunction from being caused by a short period for detection.

According to the ninth aspect of the present invention, it is possible to obtain a practical and simple structure of the resistance variable section.

According to the tenth aspect of the present invention, it is possible to obtain a practical and simple structure of the connecting means.

According to the eleventh aspect of the present invention, the current ratio detecting section calculates the ratio of at least two sense voltages output from the current and voltage converting section. Therefore, the sense voltages are directly compared with each other. Consequently, a time required for knowing the pattern of the short circuit state can be reduced and the protecting operation can be carried out in a real time.

According to the twelfth aspect of the present invention, it is possible to obtain a practical and simple structure of the current and voltage converting section.

In order to solve the above-mentioned problems, it is an object of the present invention to provide a semiconductor device comprising a short circuit protecting system capable of enhancing the detection precision of a collector current, thereby carrying out a reliable short circuit protection.

These and other objects, features, aspects and advantages of the present invention will become more apparent from the following detailed description of the present invention when taken in conjunction with the accompanying drawings.

DESCRIPTION OF THE PREFERRED EMBODIMENTS

A. First Embodiment

<A-1. Feature of First Embodiment>

First of all, two plain patterns will be described as an example of a short circuit state of an IGBT.

A first pattern implies a short circuit in a state in which the IGBT is completely operated in an active region and a collector-emitter voltage (hereinafter referred to as a collector voltage) is high.

A second pattern implies a short circuit in a state in which the IGBT is operated in a saturation region and the collector voltage is low.

A sense emitter is provided to cause a sense emitter current (hereinafter referred to as a sense current) to flow, the sense current having a predetermined ratio to an emitter current and being much smaller than the emitter current. The ratio of the sense current to the emitter current in such a state that the IGBT is short-circuited is varied between the first and second patterns. More specifically, the sense current ratio is great in the short circuit of the first pattern and is small in the short circuit of the second pattern.

This implies that the sense current is smaller in the second pattern than that in the first pattern if the emitter current is identical. It is desirable that the short circuit protecting operation should be changed depending on the short circuit state.

Moreover, when a sense emitter potential (hereinafter referred to as a sense potential) related to an emitter potential is changed, the sense current is varied. The amount of change is varied between the first and second patterns.

More specifically, in the first pattern having a high collector voltage, the sense current is less changed with a variation in the sense potential. If a value of a resistor (hereinafter referred to as a sense resistor) connected to the sense emitter is reduced, the sense potential is dropped almost proportionally thereto.

On the other hand, in the second pattern having a low collector voltage, the sense current is changed with a variation in the sense potential. When the sense potential is changed, the sense current is varied. Therefore, even if the value of the sense resistor is reduced, the sense potential is not dropped proportionally thereto.

In this respect, a first embodiment is characterized in that the sense resistance value is changed to measure each sense potential, each sense current is calculated from the sense resistance value for each sense potential, the amount of change in the sense current is detected to know a pattern of the short circuit state based on the amount of change, thereby carrying out a short circuit protecting operation corresponding to the pattern of the short circuit state.

<A-2. Structure of Device>

Figure 1:
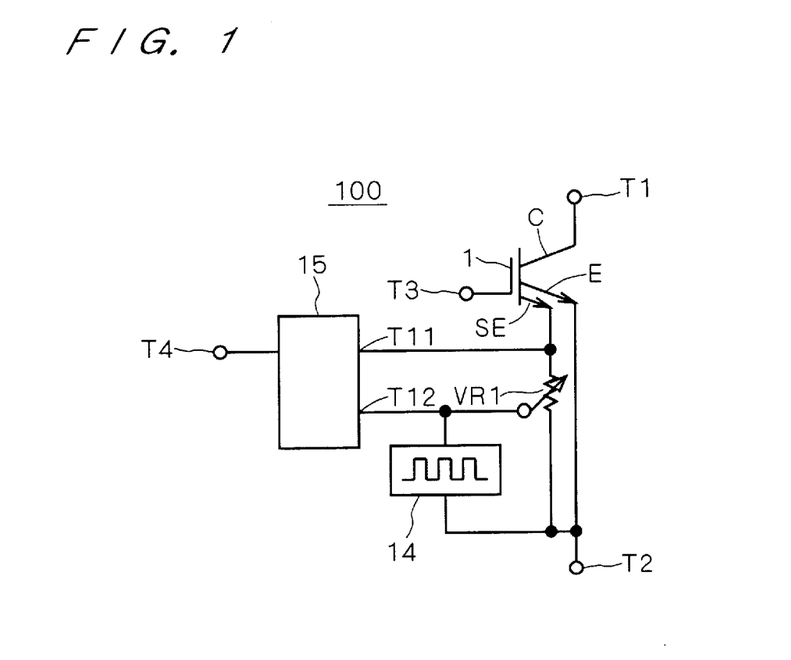
FIG. 1 is a diagram showing a structure of a semiconductor device according to a first embodiment of the present invention.

FIG. 1 shows a structure of a semiconductor device 100 according to the first embodiment of the present invention.

In FIG. 1, an IGBT 1 having a collector C connected to a terminal T1 and an emitter E connected to a terminal T2 is provided, and has a sense emitter SE connected to the terminal T2 through a variable resistor VR1 to be a current and voltage converting section. A sense potential is output from an end on the sense emitter SE side of the variable resistor VR1 and is given to a terminal T11 of a current ratio detecting section 15. A gate of the IGBT 1 is connected to a terminal T3 and an output of the current ratio detecting section 15 is connected to a terminal T4.

Moreover, an output of a resistance value changing section 14 for changing a resistance value of the variable resistor VR1 on a time basis is connected to a control terminal of the variable resistor VR1 and a terminal T12 of the current ratio detecting section 15. The variable resistor VR1 is an element for changing the resistance value according to a predetermined voltage. For example, a field effect transistor (FET) or the like is used for the variable resistor VR1, and a gate of the FET acts as a control terminal and a resistance between a drain and a source can be varied by changing a gate voltage.

Figure 2:
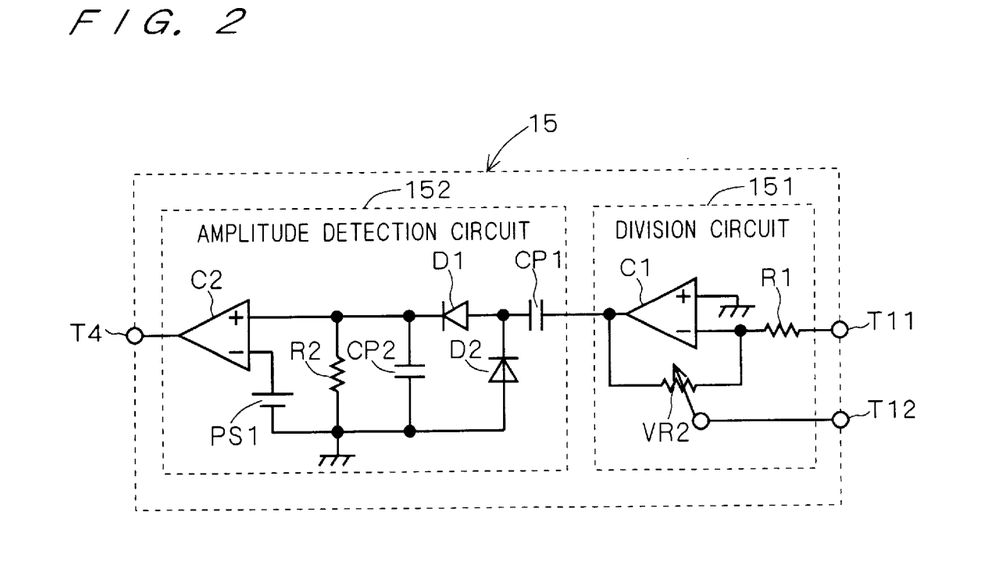
FIG. 2 is a diagram showing a partial structure of the semiconductor device according to the first embodiment of the present invention.

Next, an example of a structure of the current ratio detecting section 15 will be described with reference to FIG. 2. The current ratio detecting section 15 has a division circuit 151 on the input side and an amplitude detection circuit 152 on the output side.

The sense potential obtained from the variable resistor VR1 is input from a terminal T11 of the current ratio detecting section 15 to an input terminal on the negative side of an amplifier C1 constituting the division circuit 151 through a resistor R1. An input terminal on the positive side of the amplifier C1 is connected to a grounding potential.

Moreover, the input terminal on the negative side of the amplifier C1 is connected to an output terminal through a variable resistor VR2, and an output of the resistance value changing section 14 is given to a control terminal of the variable resistor VR2 through a terminal T12. The resistance value changing section 14 is based on an electric potential of the terminal T2.

The amplitude detection circuit 152 has a capacitor CP1 in which an output of the amplifier C1 is given to one of electrodes thereof, a diode D1 having an anode connected to the other electrode of the capacitor CP1, and an amplifier C2 in which a cathode of the diode D1 is connected to an input terminal on the positive side.

Furthermore, the amplitude detection circuit 152 has a constant voltage source PS1 having a positive electrode connected to an input terminal on the negative side of the amplifier C2 and a negative electrode connected to a grounding potential, a diode D2 having a cathode connected to the other electrode of the capacitor CP1 and an anode connected to the grounding potential, and a capacitor CP2 and a resistor R2 which are connected in parallel with each other between a wiring of the diode D1 and the input terminal on the positive side of the amplifier C2 and the grounding potential.

<A-3. Operation>

In the semiconductor device 100 shown in FIG. 1, a sense resistance (the variable resistor VR1) is changed on a time basis by using the resistance value changing section 14 to calculate a sense potential (a value obtained by dividing the sense potential by a sense resistance value, that is, a sense current) per sense resistance through the current ratio detecting section 15. By detecting the amount of change, a pattern of a short circuit state can be known.

It is sufficient that the resistance value changing section 14 changes an output thereof on a time basis, and an AD conversion output device to be controlled by a microcomputer or any waveform generator may be used.

For simplicity of the description, if the resistance value changing section 14 is an oscillator for periodically changing two high and low voltages, the sense resistance value is also changed to be high and low when the output of the resistance value changing section 14 is brought into a high potential state and a low potential state. The sense potential is also changed to be high and low with the variation. For example, in the case in which the change of the sense resistance value is proportional to the output of the resistance value changing section 14, the sense potential per sense resistance is proportional to a value obtained by dividing the sense potential by the output of the resistance value changing section 14. Therefore, the sense potential per output of the resistance value changing section 14 is calculated by the division circuit 151 included in the current ratio detecting section 15. Accordingly, although the division circuit 151 does not accurately calculate the sense current, a value proportional to the sense current is calculated. Therefore, the value thus obtained will be referred to as a sense current for convenience.

In the division circuit 151, a resistance value of the variable resistor VR2 provided in a negative feedback path is changed interlockingly with the sense resistance (the variable resistor VR1) through the output of the resistance value changing section 14, and a ratio of the sense potential per sense resistance, that is, the sense current is converted into a predetermined electric potential to be output.

An output of the division circuit 151 (an output corresponding to the sense current) which is changed corresponding to a variation in the variable resistor VR1 (that is, a variation in the output of the resistance value changing section 14) is given to the amplitude detection circuit 152. An electric potential to be proportional to a difference (amplitude) between the output potentials of the division circuit 151 in the cases in which the sense resistance is high and low is sent as an output of the amplifier C2 to the terminal T4.

It is possible to know whether the short circuit state has a first pattern or a second pattern depending on an output value at the terminal T4, that is, a difference in the amount of change of the sense current.

More specifically, in the case of the first pattern having a high collector voltage, if the value of the sense resistance is reduced, the sense potential is dropped almost proportionally thereto. Therefore, the amount of change of the sense current is increased and an electric potential of the terminal T4 is raised. In the case of the second pattern having a low collector voltage, even if the value of the sense resistance is reduced, the sense potential is not dropped proportionally thereto. Therefore, the amount of change of the sense current is small and the output potential of the terminal T4 is dropped.

By utilizing the difference in the output potential, it is possible to change the short circuit protecting operation for the first and second patterns.

<A-4. Effect>

As described above, the semiconductor device 100 according to the first embodiment of the present invention comprises the protecting system for changing the sense resistance value to vary the sense potential and for detecting the amount of change to know the pattern of the short circuit state based on the amount of change, thereby carrying out the short circuit protecting operation corresponding to the pattern of the short circuit state. Therefore, it is possible to carry out the short circuit protecting operation in consideration of a difference in the short circuit state through a magnitude of the collector voltage. Moreover, it is not necessary to detect the collector voltage. Therefore, a detection circuit corresponding to a high voltage and a large space for providing the detection circuit are not required, and a manufacturing cost can be reduced and a size of the device can be prevented from being increased.

B. Second Embodiment

<B-1. Feature of Second Embodiment>

While the variable resistor VR1 is used for the sense resistor to change the sense potential in the semiconductor device 100 according to the first embodiment described with reference to FIG. 1, means for changing the sense potential is not restricted to the variable resistor. A second embodiment is characterized in that a circuit having a small voltage drop such as a current mirror circuit is used for a current and voltage converting section and means for forcibly changing a sense potential is used separately therefrom.

<B-2. Structure of Device>

Figure 3:
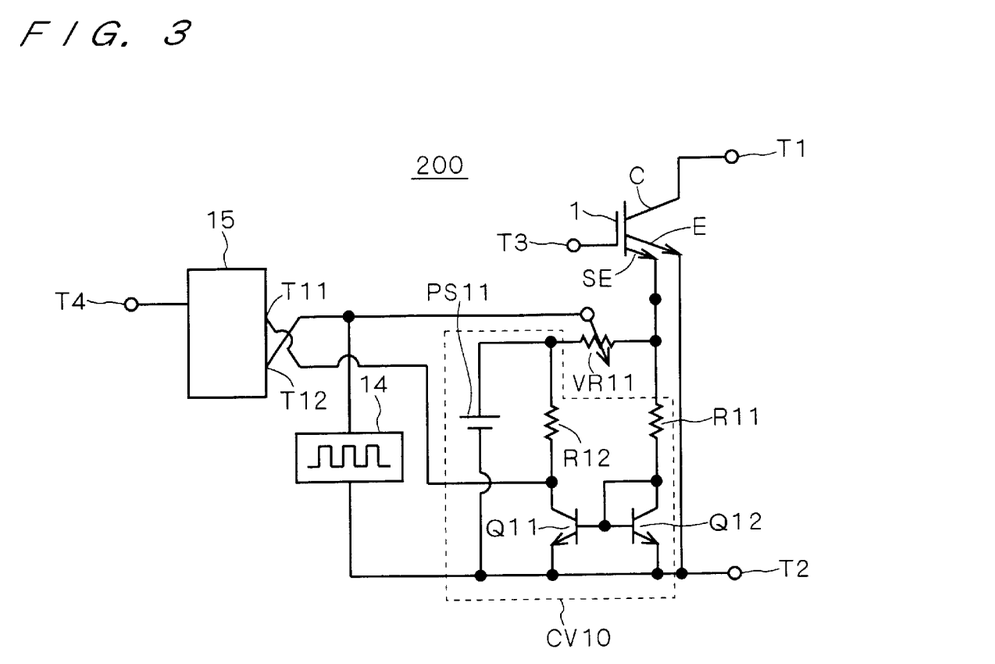
FIG. 3 is a diagram showing a structure of a semiconductor device according to a second embodiment of the present invention.

FIG. 3 shows a structure of a semiconductor device 200 according to the second embodiment of the present invention. In FIG. 3, the same structures as those in the semiconductor device 100 shown in FIG. 1 have the same reference numerals and repetitive description will be omitted.

In FIG. 3, a sense emitter SE of an IGBT 1 is connected to one of ends of a resistor R11. The resistor R11 is connected to a collector of a transistor Q12 constituting a current mirror circuit to be a current and voltage converting section CV10.

The transistor Q12 is paired with a transistor Q11 to constitute the current mirror circuit, and both gates are connected to the other end of the resistor R11 in common and both emitters are connected to a terminal T2 in common.

Moreover, a collector of the transistor Q11 is connected to a positive electrode of a constant voltage source PS11 through a resistor R12, and a negative electrode of the constant voltage source PS 11 is connected to the terminal T2.

A sense emitter voltage is output from an end on the transistor Q11 side of the resistor R12 and is given to a terminal T11 of a current ratio detecting section 15.

Moreover, a variable resistor VR11 (forcible voltage changing section) is provided between an end on the sense emitter SE side of the resistor R11 and an end connected to the constant voltage source PS11 in the resistor R12, and an output of a resistance value changing section 14 for changing a resistance value of the variable resistor VR11 on a time basis is connected to a control terminal of the variable resistor VR11 and a terminal T12 of the current ratio detecting section 15. The resistance value changing section 14 is based on an electric potential of the terminal T2.

<B-3. Operation>

In the semiconductor device 200 shown in FIG. 3, the resistance value of the variable resistor VR11 connected to the sense emitter SE is changed on a time basis by using the resistance value changing section 14. Thus, an electric potential of the sense emitter SE is forcibly changed.

Consequently, the amount of change of a sense current with a variation in the sense potential can be detected more directly through the current ratio detecting section 15.

More specifically, if the resistance value changing section 14 is an oscillator for periodically changing two high and low voltages, the sense potential is proportionally changed to be high and low when the output of the resistance value changing section 14 is brought into a high potential state and a low potential state.

However, the foregoing can be applied to the case of the first pattern in which the sense current is not changed with a variation in the sense potential but cannot be applied to the case of the second pattern in which the sense current is changed with the variation in the sense potential. Even if the value of the variable resistor VR11 is changed to forcibly apply a voltage to the sense emitter SE, the sense potential is not varied proportionally thereto.

In the case in which the change of the variable resistor VR11 is proportional to the output of the resistance value changing section 14, a sense potential per value of the variable resistor VR11 is proportional to a value obtained by dividing the sense potential by the output of the resistance value changing section 14.

Accordingly, a division circuit 151 included in the current ratio detecting section 15 calculates a sense potential for the variable resistor VR11 (that is, a value obtained by dividing the sense potential by the output of the resistance value changing section 14).

An output of the division circuit 151 (a value obtained by dividing the sense potential by the output of the resistance value detecting section 14) for each value of the variable resistor VR11 (that is, the output of the resistance value changing section 14) is given to an amplitude detection circuit 152, and an electric potential which is proportional to the amount of change (amplitude) of an output potential is sent as an output of an amplifier C2 to a terminal T4.

It is possible to know whether a short circuit state has the first pattern or the second pattern depending on an output value at the terminal T4, that is, a difference in the amount of change of the sense potential for the variation in the variable resistor VR11.

More specifically, in the case of the first pattern having a high collector voltage, if the value of the variable resistor VR11 is changed, the sense potential is varied almost proportionally thereto. Therefore, the amount of change (amplitude) is increased and an electric potential of the terminal T4 is raised. In the case of the second pattern having a low collector voltage, even if the value of the variable resistor VR11 is changed, the sense potential is not varied proportionally thereto and the amount of change (amplitude) is small. Therefore, the electric potential of the terminal T4 is dropped.

By utilizing the difference in the potential, it is possible to change the short circuit protecting operation for the first and second patterns.

<B-4. Effect>

As described above, the semiconductor device 200 according to the second embodiment of the present invention comprises the protecting system for forcibly changing the sense potential and detecting the amount of change to know the pattern of the short circuit state based on the amount of change, thereby carrying out the short circuit protecting operation corresponding to the pattern of the short circuit state. Therefore, it is possible to carry out the short circuit protecting operation in consideration of a difference in the short circuit state depending on a magnitude of the collector voltage. Moreover, it is not necessary to detect the collector voltage. Therefore, a detection circuit corresponding to a high voltage and a large space for providing the detection circuit are not required, and a manufacturing cost can be reduced and a size of the device can be prevented from being increased.

C. Third Embodiment

<C-1. Feature of Third Embodiment>

In the semiconductor device 100 according to the first embodiment described with reference to FIG. 1, the variable resistor VR1 to be a sense resistor is changed by the output of the resistance value changing section 14 on a time basis, thereby detecting the sense potential which is changed on a time basis. A third embodiment is characterized in that it is sufficient that the sense potential is changed to be at least two electric potentials in order to know a difference in a short circuit state depending on a magnitude of a collector voltage and a protecting operation can be implemented with a more simplified structure by detecting the two sense potentials.

<C-2. Structure of Device>

Figure 4:
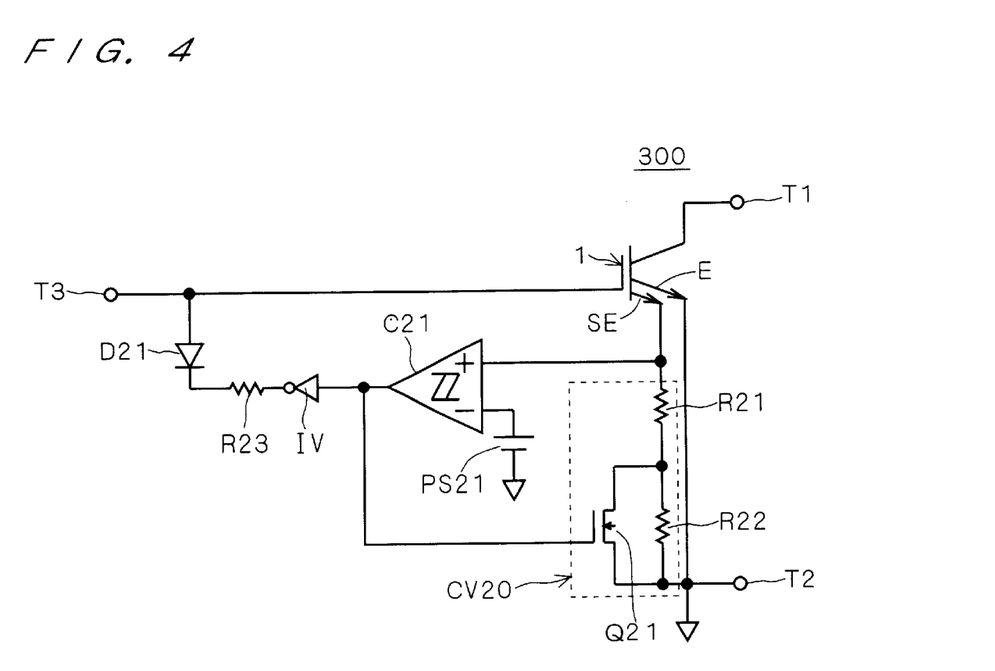
FIG. 4 is a diagram showing a structure of a semiconductor device according to a third embodiment of the present invention.

FIG. 4 shows a structure of a semiconductor device 300 according to the third embodiment of the present invention. In FIG. 4, the same structures as those in the semiconductor device 100 shown in FIG. 1 have the same reference numerals and repetitive description will be omitted.

In FIG. 4, resistors R21 and R22 connected in series are provided between a sense emitter SE of an IGBT 1 and a terminal T2, and the sense emitter SE is connected to one of ends of the resistor R21. A terminal T2 is connected to a common potential.

An end on the sense emitter SE side of the resistor R21 is connected to an input terminal on the positive side of a comparator C21 having a hysteresis, an input terminal on the negative side of the comparator C21 is connected to a positive electrode of a constant voltage source PS21, and a negative electrode of the constant voltage source PS21 is connected to the common potential. Moreover, an output of the comparator C21 is connected to a cathode of a diode D21 through a logic inverter IV and a resistor R23, and an anode of the diode D21 is connected to a gate of the IGBT 1.

An N-channel MOS transistor Q21 is connected in parallel with the resistor R22 and a gate of the N-channel MOS transistor Q21 is connected to the output of the comparator C21. The resistors R21 and R22 and the N-channel MOS transistor Q21 constitute a current and voltage converting section CV20.

<C-3. Operation>

Next, an operation of the semiconductor device 300 will be described with reference to FIGS. 5 and 6. In the semiconductor device 300, the comparator C21 having a hysteresis includes two comparison potentials based on a hysteresis characteristic.

More specifically, the comparison potentials have a first detection potential to be a comparison potential which is determined by a voltage of the constant voltage source PS21 and a voltage having a higher hysteresis of the comparator C21 and a second detection potential to be a comparison potential which is determined by the voltage of the constant voltage source PS21 and a voltage having a lower hysteresis of the comparator C21.

In the case in which a short circuit state is set to a first pattern having a high collector voltage, a sense potential is dropped almost proportionally if a value of a sense resistance is reduced. In the case of a second pattern having a low collector voltage, even if the value of the sense resistance is reduced, the sense potential is not dropped proportionally thereto. These matters have been described above. In the case in which the value of the sense resistance is equal and a collector current is also identical, the short circuit state set to the first pattern has a larger sense current and a higher sense potential than those of the short circuit state set to the second pattern.

Therefore, two comparison potentials are set to the sense potential. Whether the sense potential exceeds either or both of the two comparison potentials is detected by the comparator C21.

Figure 5:
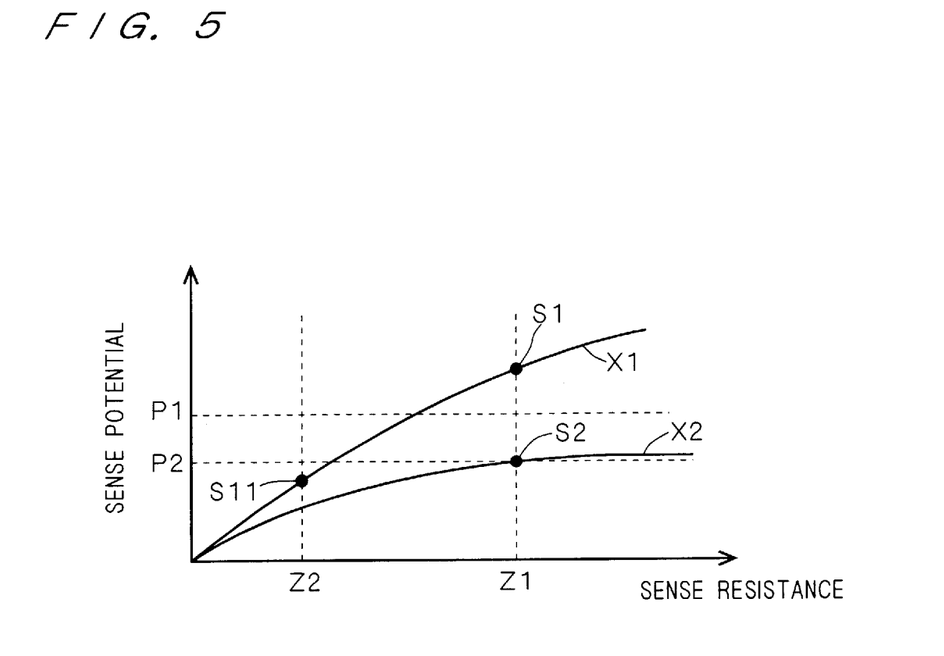
FIGS. 5 and 6 are charts illustrating an operation of the semiconductor device according to the third embodiment of the present invention.
Figure 6:
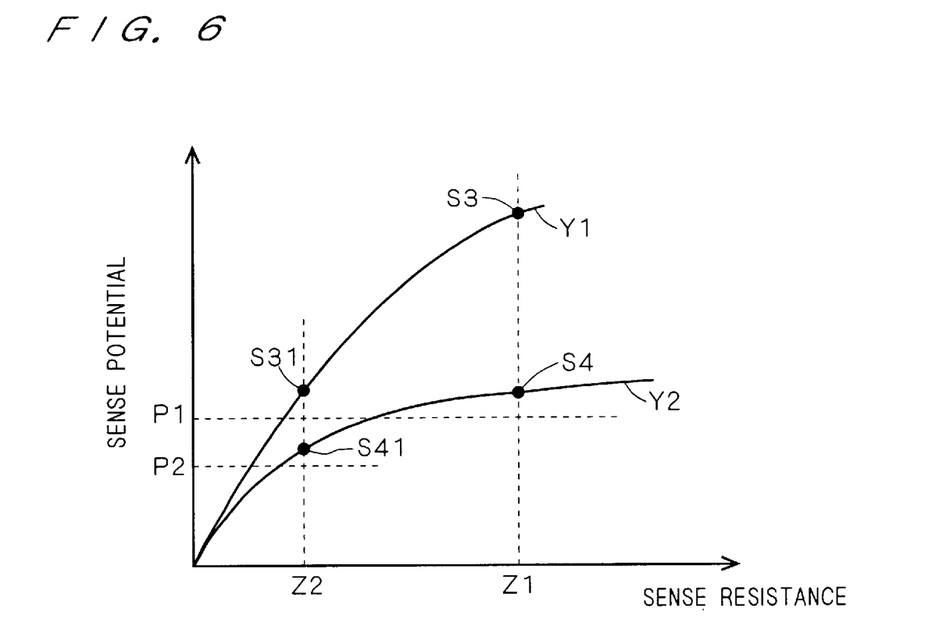

FIGS. 5 and 6 show the characteristics of the sense potential detected through the first and second detection potentials set by the comparator C21.

In FIGS. 5 and 6, an axis of abscissa indicates a sense resistance value and an axis of ordinate indicates a sense potential, the sense potential being shown with a variation in the sense resistance value. FIG. 5 shows a characteristic X1 with a high collector voltage $V_{CE}$ and a characteristic X2 with a low collector voltage $V_{CE}$ in the case in which such a collector current as not to require a protecting operation flows. FIG. 6 shows a characteristic Y1 with the high collector voltage $V_{CE}$ and a characteristic Y2 with the low collector voltage $V_{CE}$ in the case in which such a collector current as to require the protecting operation flows.

In FIGS. 5 and 6, moreover, an axis of ordinate indicates first and second detection potentials P1 and P2 set by the comparator C21, and an axis of abscissa indicates a first resistance value Z1 defined by the resistors R21 and R22 and a second resistance value Z2 defined by the resistors R21 and R22 and an ON-state resistance of an N-channel MOS transistor Q31.

In the semiconductor device 300, the sense resistance value is only switched into two values, that is, the first and second resistance values Z1 and Z2. Therefore, a maximum data point is two for each characteristic. In FIGS. 5 and 6, data are set to be continuous for convenience.

Description will be given with reference to FIG. 5. First of all, in the case in which the sense potential is sufficiently low as an initial state, an output potential of the comparator C21 is "L" and the sense resistor has the first resistance value Z1 with the N-channel MOS transistor set in an OFF state. When a short circuit of the IGBT 1 is generated in this state, the sense potential is set to S1 for the characteristic X1 and is set to S2 for the characteristic X2. In this case, an output of the logic inverter IV is "H". Therefore, a protecting operation for extracting a gate current of the IGBT 1 through the diode D21 is not executed.

Since the sense potential S1 exceeds the first detection potential P1, the comparator C21 is operated so that the output is inverted, the output potential is set to "H" and the output of the logic inverter IV is set to "L". Therefore, the protecting operation for extracting the gate current of the IGBT 1 through the diode D21 is executed. Moreover, the N-channel MOS transistor Q21 is turned ON. Consequently, the sense resistor is set to have the second resistance value Z2 and the sense potential is set to S11 at that time.

The sense potential S2 of the characteristic X2 does not exceed the second detection potential P2. Therefore, the output potential of the comparator C21 maintains "L" and the sense resistor is not switched to have the second resistance value Z2.

The sense potential S1 and the sense potential S11 make a great difference and are changed almost proportionally to a variation in the sense resistance. Therefore, it is apparent that the characteristic X1 is set in the short circuit state having the first pattern in which the collector voltage $V_{CE}$ is high.

In the short circuit state having the first pattern, if the collector current is not so high as to require the protecting operation, the sense potential is greatly dropped when the sense resistance value is reduced. As shown in FIG. 5, the sense potential S11 with the second resistance value Z2 does not reach the second detection potential P2. Therefore, the output of the comparator C21 is inverted to "L" so that the protecting operation for extracting the gate current of the IGBT 1 through the diode D21 is stopped.

Next, description will be given with reference to FIG. 6. In the case in which the sense resistor has the first resistance value Z1, the sense potential is set to S3 for the characteristic Y1 and is set to S4 for the characteristic Y2.

Since the sense potential S3 for the characteristic Y1 exceeds the first detection potential P1, the comparator C21 is operated so that the output is inverted, the output potential is set to "H" and the output of the logic inverter IV is set to "L". Therefore, the protecting operation for extracting the gate current of the IGBT 1 through the diode D21 is executed. Moreover, the N-channel MOS transistor Q21 is turned ON. Consequently, the sense resistor is set to have a second resistance value Z2 and the sense potential is set to S31 at that time.

The sense potential S3 and the sense potential S31 make a great difference and are changed almost proportionally to a variation in the sense resistance. Therefore, it is apparent that the characteristic Y1 is set in the short circuit state having the first pattern in which the collector voltage $V_{CE}$ is high.

In the short circuit state having the first pattern, if the collector current is so high as to require the protecting operation, the sense potential is also increased wholly. As shown in FIG. 6, the sense potential S31 with the second resistance value Z2 exceeds the second detection potential P2. Therefore, the output of the comparator C21 maintains "H" so that the protecting operation for extracting the gate current of the IGBT 1 through the diode D21 is maintained. The protecting operation is maintained until the collector current of the IGBT 1 is decreased and the sense potential is reduced to be lower than the second detection potential P2.

The diode D21 can be referred to as connecting means for electrically connecting a gate of the IGBT 1 to a predetermined electric potential based on the output of the comparator C21. In place of the diode D21, for example, a switch element may be used to carry out a switching operation through the output of the comparator C21.

Moreover, since the sense potential S4 for the characteristic Y2 also exceeds the first detection potential P1, the comparator C21 is operated so that the output is inverted, the output potential is set to "H" and the output of the logic inverter IV is set to "L". Therefore, the protecting operation for extracting the gate current of the IGBT 1 through the diode D21 is executed. Furthermore, the N-channel MOS transistor Q21 is turned ON. Consequently, the sense resistor is set to have a second resistance value Z2 and the sense potential is set to S41 at that time.

The sense potential S4 and the sense potential S41 make a small difference and are not changed proportionally to a variation in the sense resistance. Therefore, it is apparent that the characteristic Y2 is set in the short circuit state having the second pattern in which the collector voltage $V_{CE}$ is low.

In the short circuit state having the second pattern, if the collector current is so high as to require the protecting operation, the sense potential is also increased wholly. As shown in FIG. 6, the sense potential S41 with the second resistance value Z2 exceeds the second detection potential P2. Therefore, the output of the comparator C21 maintains "H" so that the protecting operation for extracting the gate current of the IGBT 1 through the diode D21 is maintained. The protecting operation is maintained until the collector current of the IGBT 1 is decreased and the sense potential is reduced to be lower than the second detection potential P2.

<C-4. Effect>

As described above, the semiconductor device 300 according to the third embodiment of the present invention comprises the protecting system for comparing the sense potential with the two comparison potentials by using the comparator C21 having a hysteresis for the detection of the sense potential. Therefore, it is possible to know the difference in the short circuit state depending on a magnitude of the collector current as well as a magnitude of the collector voltage. Thus, the short circuit protecting operation can be carried out more properly.

<D. Fourth Embodiment>

<D-1. Feature of Fourth Embodiment>

The semiconductor device 300 according to the third embodiment described with reference to FIG. 4 has such a structure that the sense potential is compared with the two comparison potentials by using the comparator having a hysteresis for detecting the sense potential. However, the sense current often includes a noise and a shift for the noise is generated if integration is not carried out through a low-pass filter or the like. Therefore, it is impossible to optionally change a period for detection.

A fourth embodiment is characterized in that means for detecting the sense potential by the two comparators, thereby extending a period for detection of a comparator to determine the execution and stop of a protecting operation is provided to prevent a malfunction from being caused by a short period for detection.

<D-2. Structure of Device>

Figure 7:
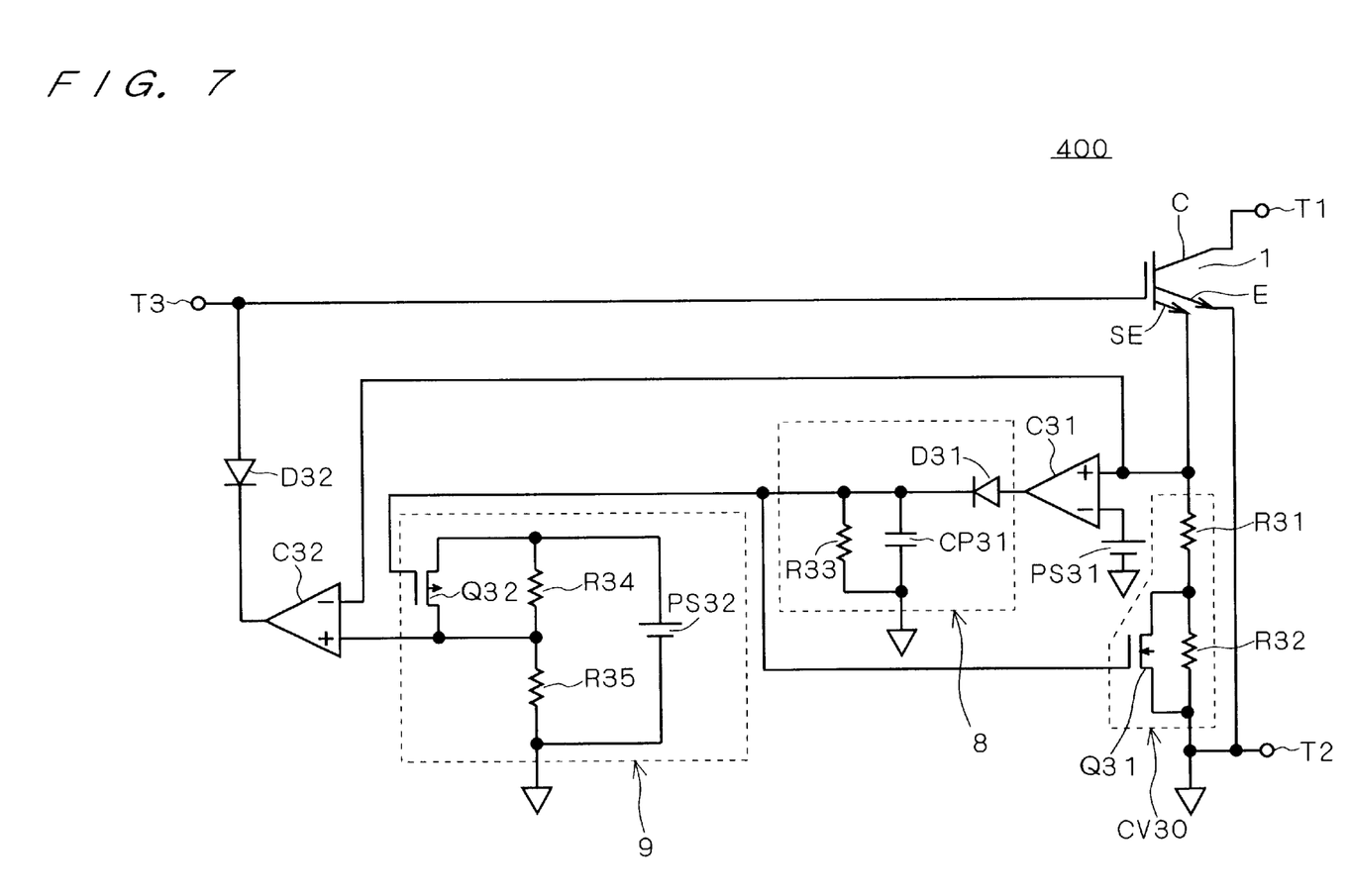
FIG. 7 is a diagram showing a structure of a semiconductor device according to a fourth embodiment of the present invention.

FIG. 7 shows a structure of a semiconductor device 400 according to the fourth embodiment of the present invention. In FIG. 7, the same structures as those in the semiconductor device 100 shown in FIG. 1 have the same reference numerals and repetitive description will be omitted.

In FIG. 7, resistors R31 and R32 connected in series are provided between a sense emitter SE of an IGBT 1 and a terminal T2, and the sense emitter SE is connected to one of ends of the resistor R31. The terminal T2 is connected to a common potential.

An end on the sense emitter SE side of the resistor R31 is connected to an input terminal on the positive side of a comparator C31 (a first comparator), an input terminal on the negative side of the comparator C31 is connected to a positive electrode of a constant voltage source PS31, and a negative electrode of the constant voltage source PS31 is connected to the common potential. Moreover, an output of the comparator C31 is connected to an anode of a diode D31.

An N-channel MOS transistor Q31 is connected in parallel with the resistor R32 and a gate of the N-channel MOS transistor Q31 is connected to a cathode of the diode D31. The resistors R31 and R32 and the N-channel MOS transistor Q31 constitute a current and voltage converting section CV30.

Moreover, a capacitor CP31 and a resistor R33 are connected in parallel between the cathode of the diode D31 and the common potential, and constitutes a pulse extension circuit 8 together with the diode D31.

Moreover, the cathode of the diode D31 is connected to a gate of a P-channel MOS transistor Q32.

An input terminal on the positive side of a comparator C32 (a second comparator) is connected to a drain of the P-channel MOS transistor Q32, a source of the P-channel MOS transistor Q32 is connected to a positive electrode of a constant voltage source PS32, and a negative electrode of the constant voltage source PS32 is connected to a common potential. Moreover, resistors R34 and R35 connected in series are provided between a source of the P-channel MOS transistor Q32 and the common potential and the input terminal on the positive side of the comparator C32 is connected to a node of the resistors R34 and R35.

The P-channel MOS transistor Q32, the resistors R34 and R35 and the constant voltage source PS32 constitute a variable d.c. voltage source 9.

Moreover, an input terminal on the negative side of the comparator C32 is connected to the input terminal on the positive side of the comparator C31, and an output of the comparator C32 is connected to a cathode of a diode D32. An anode of the diode D32 is connected to a gate of the IGBT 1.

<D-3. Operation>

Next, an operation of the semiconductor device 400 will be described. A comparison potential to be used for the comparator C31 is set to a first detection potential, and lower and higher comparison potentials which are to be used for the comparator C32 are set to second and third detection potentials, respectively. The third detection potential is the highest and the second detection potential is the lowest.

First of all, in the case in which a sense potential is lower than the first detection potential of the comparator C31 as an initial state, an output potential of the comparator C31 is "L", a capacitor CP31 is sufficiently discharged, the N-channel MOS transistor Q31 is set in an OFF state and a sense resistance is set to be so high as to be defined by the resistors R31 and R32.

On the other hand, the P-channel MOS transistor Q32 is set in an ON state and a high potential which is almost equivalent to a voltage of the constant voltage source PS32 is given as the third detection potential to the input terminal on the positive side of the comparator C32 so that the output of the comparator C32 is set to "H". Therefore, a gate current of the IGBT 1 is not extracted through the diode D32.

Then, when a collector current is increased due to a short circuit or the like so that the sense potential exceeds the first detection potential of the comparator C31, the output potential of the comparator C31 is set to "H", the N-channel MOS transistor Q31 is turned ON, and the sense resistance is set to be so low as to be defined by the resistors R31 and R32 and an ON-state resistance of the N-channel MOS transistor Q31. Thus, the sense potential is dropped. At this time, the P-channel MOS transistor Q32 is brought into an OFF state, and an electric potential obtained by dividing and dropping the voltage of the constant voltage source PS32 by the resistors R34 and R35 is given as the second detection potential to the input terminal on the positive side of the comparator C32.

When the output potential of the comparator C31 is set to "H" so that the capacitor CP31 is charged, "H" is given to the gate of the P-channel MOS transistor Q32 for some period (before an electric charge of the capacitor CP31 is discharged with a time constant of an RC circuit constituted by the capacitor CP31 and the resistor R33 in the pulse extension circuit 8) and an OFF state is continuously maintained even if the output potential of the comparator C31 is then changed to "L". Thus, the pulse extension circuit 8 immediately outputs "H" if a logic to be given to an input thereof is changed from "L" to "H", and does not immediately output "L" but extends a period for "H" if the logic to be given to the input is changed from "H" to "L". In order to prevent the start of a protecting operation from being delayed, a logic of extension through the diode D31 is restricted.

For this period, a short circuit state of the IGBT 1 is detected based on the second detection potential through the comparator C32.

In the case in which the short circuit state is set to a second pattern having a low collector voltage, a ratio of a sense current to a collector current is low. Therefore, when the comparator C31 is operated, the collector current has already reached such a level as to be protected. Accordingly, when the sense resistance is changed to be low so that the sense potential is dropped, the ratio of the sense current to the collector current is increased and a decrease in the sense current is suppressed so that a reduction in the sense potential is stopped.

In the comparator C32, the sense potential is compared with the second detection potential. If the sense potential is higher, the output of the comparator C32 is set to "L" and a protecting operation for extracting the gate current of the IGBT 1 through the diode D32 is executed. Even if a gate voltage is dropped so that the collector current is reduced, the protecting operation is continuously maintained until the electric charge of the capacitor CP31 is discharged with the time constant of the RC circuit constituted by the capacitor CP31 and the resistor R33 in the pulse extension circuit 8.

On the other hand, in the case in which the short circuit state is set to a first pattern having a high collector voltage, a ratio of a sense current to a collector current is high. Therefore, when the comparator C31 is operated, there is a possibility that the collector current has not reached such a level as to be protected. Accordingly, even if the sense resistance is changed to be low so that the sense potential is dropped, the ratio of the sense current to the collector current is less increased and the sense current is considerably decreased. Therefore, the sense potential is also dropped considerably.

In the comparator C32, the sense potential is compared with the second detection potential. The second detection potential is previously set based on the short circuit characteristic of the IGBT 1 such that the sense potential becomes lower in this case. Consequently, the output of the comparator C32 maintains "H" so that the protecting operation for extracting the gate current of the IGBT 1 through the diode D32 is executed.

Also in the case in which the short circuit state is set to the first pattern having a high collector voltage, the sense current is also increased sufficiently if the collector current reaches such a magnitude as to be protected. Therefore, the sense potential is also high to reach the second detection potential of the comparator C32, and the output of the comparator C32 is set to "L" so that the protecting operation for extracting the gate current of the IGBT 1 through the diode D32 is executed.

While the protecting operation is reset by discharging the electric charge of the capacitor CP31 as described above, an inductive load is often used for a load to be connected to a power semiconductor element such as an IGBT. In the case in which the inductive load is used, a collector current is reduced if a gate potential of the power semiconductor element is dropped. Thus, a collector voltage is increased at a stretch. Consequently, the comparator C32 is always operated so that the protecting operation is continuously maintained.

<D-4. Effect>

As described above, the semiconductor device 400 according to the fourth embodiment of the present invention comprises the protecting system for detecting the sense potential by the two comparators C31 and C32 and for extending, through the pulse extension circuit 8, the period for detection of the comparator C32 to determine the execution and stop of the protecting operation. Therefore, it is possible to prevent a malfunction from being caused by a short period for detection.

<E. Fifth Embodiment>

<E-1. Feature of Fifth Embodiment>

In the semiconductor device 100 according to the first embodiment described with reference to FIG. 1, the sense potential is changed by using the variable resistor VR1 as a sense resistor, the sense potentials for various sense resistances are generated with a time division and a variation in the sense potential for the change of the sense resistance is detected to know the short circuit state. Different sense resistors are connected to a plurality of sense emitters to obtain various sense potentials at the same time. By directly comparing the different sense potentials with each other, it is possible to know a difference in the short circuit state more efficiently.

<E-2. Structure of Device>

Figure 8:
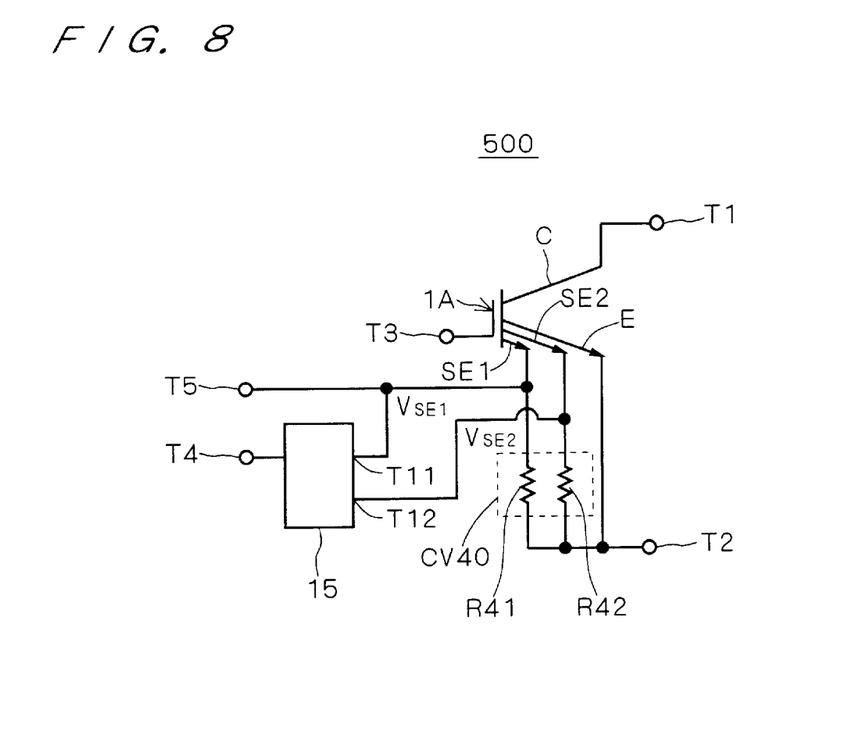
FIG. 8 is a diagram showing a structure of a semiconductor device according to a fifth embodiment of the present invention.

FIG. 8 shows a structure of a semiconductor device 500 according to a fifth embodiment of the present invention. In FIG. 8, the same structures as those in the semiconductor device 100 shown in FIG. 1 have the same reference numerals and repetitive description will be omitted.

In FIG. 8, an IGBT 1A having a collector C connected to a terminal T1 and an emitter E connected to a terminal T2 is provided, and has sense emitters SE1 and SE2 connected to the terminal T2 through resistors R41 and R42 having different resistance values which constitute a current and voltage converting section CV40. Sense potentials $V_{SE1}$ and $V_{SE2}$ are output from ends on the respective sense emitter SE sides of the resistors R41 and R42 and are given to terminals T11 and T12 of a current ratio detecting section 15. The sense potential $V_{SE1}$ is also given to a terminal T5.

<E-3. Operation>

In the semiconductor device 500 shown in FIG. 8, the resistors R41 and R42 are connected to the sense emitters SE1 and SE2 respectively to obtain different sense potentials corresponding to resistance values, and the respective sense potentials are given to the current ratio detecting section 15 to detect their ratio. Thus, a pattern of a short circuit state can be known.

More specifically, the IGBT has such a characteristic that a sense current is also changed with a variation in the sense potential as described above. Therefore, if a sense resistance is varied, the sense potential is also changed. The ratio is varied for first and second patterns of the short circuit state.

For example, a ratio of the sense potentials S3 and S31 of the characteristic Y1 (the short circuit state having the first pattern) is different from that of the sense potentials S4 and S41 of the characteristic Y2 (the short circuit state having the second pattern) in FIG. 6. If information about the ratio of the sense potentials for each pattern of the short circuit state is prepared, the pattern of the short circuit state can be known easily based on the ratio thus obtained.

In the division circuit 151 (FIG. 2) of the current ratio detecting section 15, the resistance value of the variable resistor VR2 provided in the negative feedback path is changed depending on the sense potential $V_{SE2}$ and a ratio of the sense potential $V_{SE1}$ to the sense potential $V_{SE2}$ is converted into a predetermined electric potential to be output.

The output of the division circuit 151 is given to the amplitude detection circuit 152 and an electric potential proportional to an output potential is sent as an output of the amplifier C2 to a terminal T4. In the present embodiment, it is sufficient that the ratio of the sense potential $V_{SE1}$ to the sense potential $V_{SE2}$ is apparent. Therefore, the amplitude detection circuit 152 may not be provided and the output of the division circuit 151 may be set to the output of the amplifier C2.

By utilizing a difference in the output potential, it is possible to vary a short circuit protecting operation for the first and second patterns.

<E-4. Effect>

As described above, the semiconductor device 500 according to the fifth embodiment of the present invention comprises the protecting system for connecting the resistors R41 and R42 to the sense emitters SE1 and SE2 respectively to obtain different sense potentials corresponding to resistance values and for giving each of the sense potentials to the current ratio detecting section 15 to know the pattern of the short circuit state based on their ratio. Therefore, the different sense potentials corresponding to the resistance values are obtained at the same time and are directly compared with each other. Consequently, it is possible to reduce a time required for knowing the pattern of the short circuit state. Thus, a protecting operation can be carried out in a real time.

While the resistors R41 and R42 have the different resistance values in the above description, the resistance values may be equal to each other and a current ratio of the sense emitters SE1 and SE2 may be varied.

More specifically, the sense emitter is changed into independent electrodes obtained by electrically isolating a part of an emitter electrode on an area basis, and a current is fetched therefrom. Therefore, if each area of the electrodes to be isolated is changed, a value of the current thus fetched can also be varied.

When the current value is changed, the sense potential is varied with the same resistance value. Therefore, it is possible to obtain the same effects as those in the connection of resistors having different resistance values.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
a transistor having a sense emitter; and
a protecting system for carrying out a protecting operation for detecting a sense current flowing to said sense emitter to control a collector current,
said protecting system including:
a current and voltage converting section having a variable resistor for converting said sense current into different voltages by change of a resistance value thereof, thereby generating a plurality of sense voltages; and
a current ratio detecting section for receiving said sense voltages output from said current and voltage converting section and information about a resistance value of said variable resistor corresponding to said sense voltages, thereby calculating a ratio of each of said sense voltages to each of said resistance values and detecting an amount of change of said ratio thus calculated.

2. The semiconductor device according to claim 1, wherein a resistance value of said variable resistor is varied in response to a voltage signal which is changed on a time basis,
said information about said resistance value of said variable resistor is said voltage signal which is changed on a time basis, and
said resistance value of said variable resistor and said voltage signal which is changed on a time basis have a proportional relationship.

3. A semiconductor device comprising:
a transistor having a sense emitter; and
a protecting system for carrying out a protecting operation for detecting a sense current flowing to said sense emitter to control a collector current,
said protecting system including:
a current and voltage converting section for converting said sense current into a voltage and outputting said voltage;
a forcible voltage changing section for applying external voltages having different values to said sense emitter and forcibly changing a sense emitter potential by said current and voltage converting section, thereby outputting said voltages thus changed as a plurality of sense voltages from said current and voltage converting section; and
a current ratio detecting section for receiving said sense voltages output from said current and voltage converting section and information about said external voltages corresponding to said sense voltages, thereby calculating a ratio of each of said sense voltages to each of said external voltages and detecting an amount of change of said ratio thus calculated.

4. The semiconductor device according to claim 3, wherein said current and voltage converting section is a current mirror circuit having an input section connected to said sense emitter,
said external voltage is generated by a variable resistor connected between an output end of a voltage source of said current mirror circuit and said sense emitter,
a resistance value of said variable resistor is changed in response to a voltage signal which is changed on a time basis,
said information about said external voltage is said voltage signal which is changed on a time basis, and
said resistance value of said variable resistor and said voltage signal which is changed on a time basis have a proportional relationship.

5. A semiconductor device comprising:
a transistor having at least two sense emitters; and
a protection system for carrying out a protecting operation for detecting a sense current flowing to said at least two sense emitters to control a collector current,
said protection system including:

a current and voltage converting section for converting said sense current flowing to said at least two sense emitters into at least two sense voltages which are different from each other; and a ratio detection section receiving said at least two sense voltages output from said current and voltage converting section and calculating a ratio of said at least two sense voltages.

6. The semiconductor device according to claim 5, wherein said current and voltage converting section includes at least two resistors having different resistance values which are connected between said at least two sense emitters and an emitter of said transistor, respectively.

* * * * *